United States Patent [19]
Simeau

[11] 3,942,078
[45] Mar. 2, 1976

[54] SYSTEMS COMPRISING A RELAXATION OSCILLATOR PARTICULARLY FOR ELECTRICAL IGNITERS

[75] Inventor: Bernard Simeau, Chadrac, France
[73] Assignee: Constructions Electriques R.V., Le Puy, France
[22] Filed: Dec. 19, 1974
[21] Appl. No.: 534,210

[30] Foreign Application Priority Data
Feb. 20, 1974 France .............................. 74.05765

[52] U.S. Cl. ......... 317/142 R; 317/96; 315/209 CD
[51] Int. Cl.² ......................................... H05B 37/02
[58] Field of Search...... 317/141 R, 142 R, 96, 151; 315/209 CD, 209 SC, 241, 245

[56] References Cited
UNITED STATES PATENTS
3,474,291  10/1969  Kallage......................... 315/209 CD Primary Examiner—J. D. Miller
Assistant Examiner—Harry E. Moose, Jr.
Attorney, Agent, or Firm—Burgess, Ryan and Wayne

[57] ABSTRACT

The invention relates to systems comprising a triggering element such as a thyristor triggered from a relaxation oscillator and relates more particularly to an electrical igniter.

In this system means are provided for ensuring the automatic decrease of the intensity of the triggering pulses supplied by the oscillator so that triggering automatically stops after a predetermined time. These means comprise a timing mechanism formed by a resistance inserted in series in the discharge circuit of the oscillator with a capacitor and diode in parallel on the said resistance, the diode being oriented so as to charge the capacitor under the action of pulses supplied by the oscillator.

The invention can be applied to an igniter for gas burners.

9 Claims, 4 Drawing Figures 3,942,078

SYSTEMS COMPRISING A RELAXATION OSCILLATOR PARTICULARLY FOR ELECTRICAL IGNITERS

BACKGROUND TO THE INVENTION

The invention relates to systems of the type comprising a triggering element such as a thyristor which is triggered by a relaxation oscillator or the like. It relates more particularly to electrical igniters for domestic household appliances or the like.

It is known, particularly in this special application to igniters (taken solely as an example), that systems of the type in question comprise for the generation of ignition sparks a voltage raising pulse transformer wherein the sudden discharge of an energy store capacitor from a thyristor or the like, itself controlled by a relaxation oscillator causes the emission of a high pulsating voltage at the ignition electro terminals close to the igniters in question resulting in sparks being formed.

The operation of such igniters is controlled by a switch operated either manually by a push button or indirectly by a mechanism linked with the operation of gas taps or the like.

This switch must be kept closed throughout the pulse formation period until ignition occurs. It represents a constraint for the operator because he cannot use his hand during the period of operation.

BRIEF SUMMARY OF INVENTION

The invention proposes that by adding appropriate means the operation can be instantaneous, i.e. in the form of a single pulse, whereby thyristor triggering stops automatically after a predetermined time.

To achieve this object with the relaxation oscillator is combined a timing mechanism which is able to progressively reduce the amplitude of the triggering pulses which it supplies to the thyristor until a value is reached which is insufficient to bring about triggering. Thus, starting with an instantaneous initial excitation, the thyristor is triggered during a certain time which is a function of the characteristics of the timing mechanism and without intervention on the part of the operator being necessary.

This timing mechanism substantially comprises the assembly of a series resistance in the oscillator circuit and in parallel with a capacitor and a series diode, so that this assembly is combined with the relaxation oscillator and more particularly with the capacitor thereof. Its effect is such that the capacitor of the timing mechanism progressively charges with each relaxation pulse, hence there is a decrease in the amplitude of the said pulses until they are below the threshold intensity for releasing the thyristor.

In such an assembly where the relaxation oscillator for example comprises in per se known manner the assembly of a capacitor and a neon tube or other identical ignitable device having a switching threshold, it should be noted that the said assembly remains energized, i.e. it continues, even when the pulses have dropped below the above indicated threshold intensity, to supply pulses which are however inadequate for triggering the thyristor. Thus the appliance is always ready to operate again (through reconnecting it by instantaneous discharge of the timing mechanism capacitor) so that there is no danger of ignition delays as is the case with known appliances.

Other than these arrangements, the invention is directed towards other arrangements which can be preferably used at the same time and which will be explained in greater detail herinafter.

It particularly aims at a certain applicationmode (where applied to igniters or burners on domestic appliances or the like) as well as to certain embodiments of the said arrangements. It aims more particularly and as new industrial products to assemblies of the type in question wherein these arrangements are used as well as to the special components used in producing them and the installations, more particularly domestic appliances in which they are incorporated.

BRIEF DESCRIPTION OF THE DRAWINGS

Other and further objects of the present invention will be apparent from the following description and claims and are illustrated in the accompanying drawings which by way of illustration show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the present invention and the scope of the appended claims.

In the drawings show.

DETAILED DESCRIPTION OF THE PREFERRED EMBODIMENTS

According to the invention and more particularly according to its preferred application modes and embodiments wherein it is proposed for example, among other possible applications, to produce an electrical igniter for gas appliances with a thyristor triggered by a relaxation circuit one proceeds in the following or in a similar manner.

Figure 1:
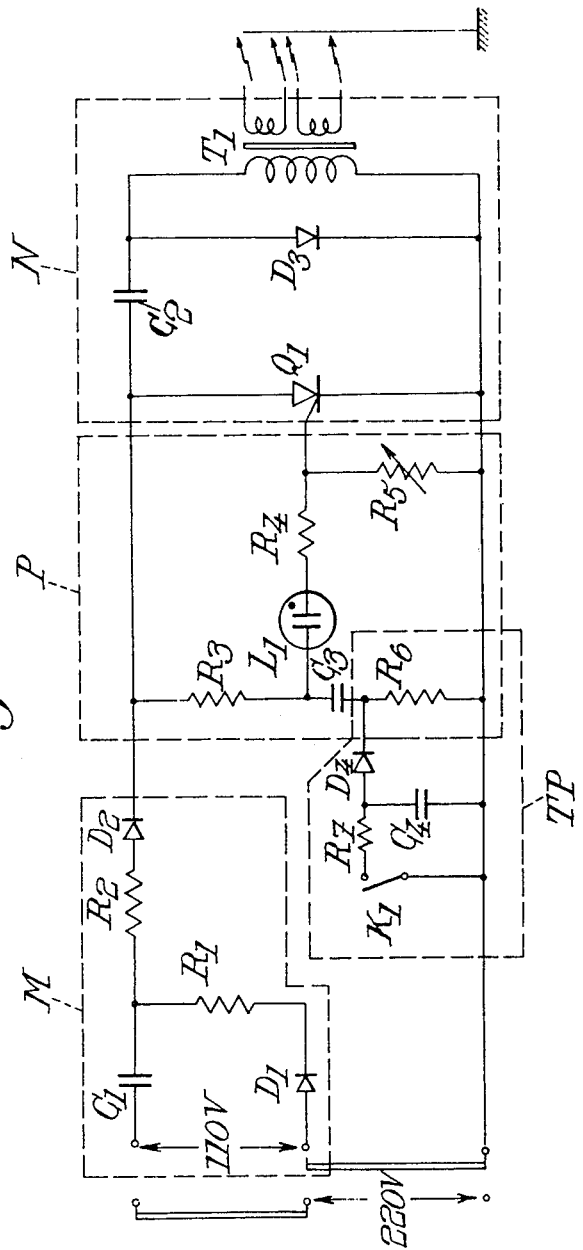
FIG. 1 an electrical circuit diagram for an igniter according to the invention.

In FIG. 1 is shown the essential components and elements of an igniter of the known type which are as follows:

a supply circuit M comprising the rectifier devices of the input voltage (220V or 110V), thus capacitor $C_1$, resistance $R_1$, $R_2$ and diodes $D_1$, $D_2$.

an energy distribution circuit N from a thyristor $Q_1$ which controls a voltage raising transformer $T_1$ and an energy store capacitor $C_2$ with a parallel diode $D_3$.

and a control circuit P comprising a relaxation oscillator with a neon tube $L_1$ combined with an integrating circuit supplied by a capacitor $C_3$ and a resistance $R_3$ so that to the triggering electrode of thyristor $Q_1$ are supplied triggering pulses combined with resistances $R_4$, $R_5$ (and another resistance such as $R_6$ which will be described hereinafter) which meter the amplitude.

The intensity of these current pulses is made relatively high so that in all circumstances it is above the triggering current Igt of the thyristor but still being sufficiently low so as not to impair the characteristics of neon tube $L_1$.

Without the timing mechanism, to be discussed hereinafter, the pulses would always have an intensity greater than Igt so that at the top of the appliance it would always be necessary to provide a switch which would have to be closed throughout ignition and opened again after ignition had taken place.

According to the invention, to the oscillator is added a timing mechanism TP whose function is to progressively reduce the amplitude of the pulses supplied by the thyristor oscillator until they are below Igt. Therefore ignition is stopped automatically in such a way that it is no longer necessary to operate a control switch after an initial connecting pulse has been given.

Thus, this device essentially comprises a capacitor which charges during each pulse which thereby modifies the characteristics of the system without however changing the pulse recurrence (frequency which is about 2 Hz).

Thus, the present device substantially comprises for example:

a capacitor $C_4$ combined with the diode $D_4$ and a parallel resistance $R_6$ arranged in series on one of the terminals of capacitor $C_3$ of the relaxation oscillator, whereby the said resistance $R_6$ is also in series in the discharge circuit of the relaxation oscillator.

a resistance $R_7$ combined with a switch $K_1$ at the terminals of capacitor $C_4$ in order to permit the discharge of the latter whenever desired.

Capacitor $C_4$ has a capacitance which is greater than that of capacitor $C_3$, e.g. 10 to 20 times greater.

The system which is connected to supply device M, operates in the following manner.

With diode $D_4$ appropriately orientated, the successive pulses from relaxation device P served to charge in successive levels capacitor $C_4$ which therefore assumes an increasing voltage.

When the charging of $C_4$ is complete only a negligible current passes through diode $D_4$. Thus, the discharge current of capacitor $C_3$ of relaxation circuit P is limited by the total resistance of the discharge circuit comprising in addition to resistance $R_4$ and the trigger cathode gap of thyristor $Q_1$ shunted on resistance $R_5$, the above mentioned resistance $R_6$.

Thus, through an appropriate choice of the value of resistance $R_6$ it is possible to give any predetermined value to discharge current $C_3$ which will be reached asymptotically on completing the charging of capacitor $C_4$. This value will be chosen so that the thyristor triggering current, Igt, is no longer reached.

Thus, finally the thyristor only supplies to distribution circuit N a limited number of pulses.

After such a cycle, a new cycle can be obtained at any time by means of a connecting pulse, i.e. momentarily closing switch $K_1$ so as to almost instantaneously discharge capacitor $C_4$ resulting in pulses whose intensity is greater than Igt and which gradually decrease as described hereinbefore.

Thus, the operation of the appliance comprises momentarily operating switch $K_1$.

Figure 2:
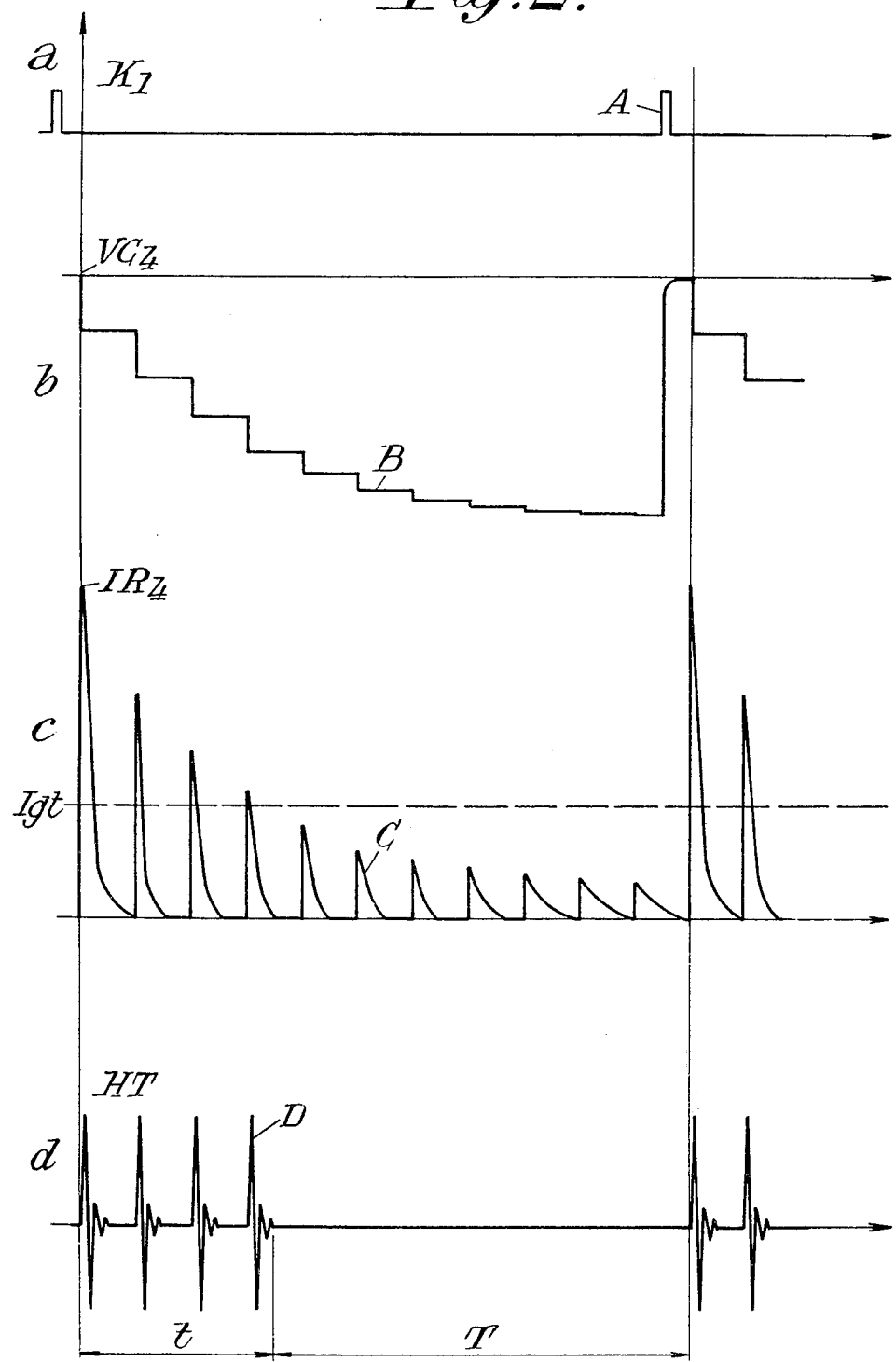
FIG. 2 comprises four diagrams, $a, b, c, d$ showing the reciprocal pulses of the various circuits of the appliance.

FIG. 2 shows the speed and appearance of these phenomena. In FIG. 2 can be seen:

at $a$, schematically, the control pulses A corresponding to the closing of $K_1$, i.e. the discharge of capacitor $C_4$, at $b$, the stepped curve 3 of capacitor $C_4$, at $c$, the curve C of the pulses supplied by P to the trigger of thyristor $Q_1$, these pulses being of constant frequency but of variable intensity, and at $d$, the high voltage pulses D supplied by the transformer synchronously with pulses C, in the zones where they are greater than Igt.

The frequency of the pulses will be determined according to the characteristics of the relaxation circuit and as indicated hereinbefore will be of the order of 2 Hz. For resistance $R_6$ a value which is considerably lower than the value of resistance $R_3$ of the integrating circuit of the relaxation oscillator is chosen so that the recurrence frequency $f$ is not greatly influenced by the presence of timing circuit TP. In this way, the operating frequency of the igniter is stable during timing period $t$ (FIG. 2).

It should be noted that the relaxation oscillator continues to function permanently during the period T separating two ignition phases due to the presence of resistance $R_6$ which recloses the discharge circuit of capacitor $C_3$.

When applied to domestic igniters, this leads to the advantage of eliminating delays on igniting neon tubes. It is in fact known that when these components are placed in the inoperative state in the dark, as can happen inside a domestic appliance, due to recombination the free ions of their atmosphere can disappear, these normally being regenerated by photoelectric emissions of the electrodes and are necessary to obtain ignition.

Thus, ignition delays which are sometimes of the order of minutes are avoided whereby the periodic lighting up of the neon tube due to the permanent operation of the relaxation oscillator maintains the constant presence of free ions.

A timing adjustment or a compensation of the dispersions of the characteristics of the components can be obtained, if necessary, by modifying the value of resistance $R_5$ shunted in the trigger-cathode gap of thyristor $Q_1$.

Thus, the triggering pulses applied to the thyristor can be made to vary within very wide limits provided that they reliably trigger the thyristor in the timing phase. Therefore, they can be made much lower than the triggering current Igt as shown in FIG. 2 at C. This represents a safety factor protecting the thyristor from undesired erratic releases, more particularly in the case of momentary variations in the mains voltage.

Switch $K_1$ which starts up the igniter by discharging capacitor $C_4$ can be operated, as stated hereinbefore, through controlling a tap, e.g. in the following manner with reference to FIGS. 3 and 4.

Figure 3:
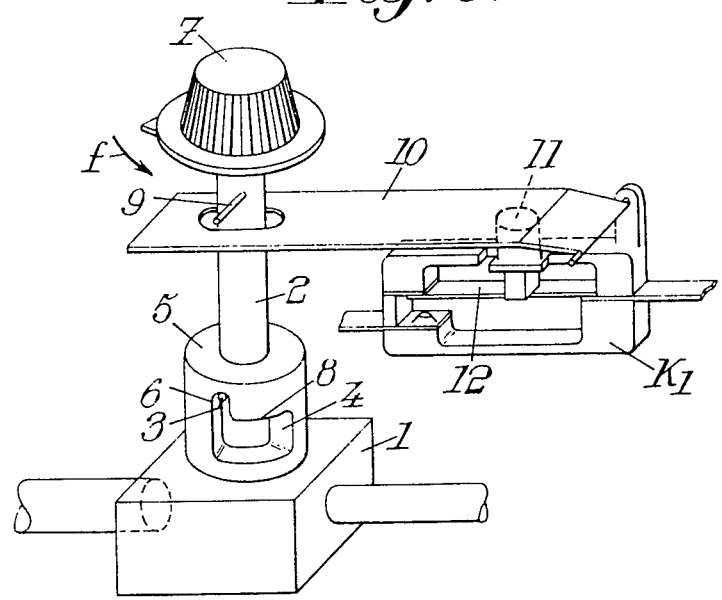
FIGS. 3 and 4, in schematic perspective representation, a gas tap provided with switching means combined with an igniter of the present type in two operating positions.

FIG. 3 shows a gas control tap 1 which is closed in its inoperative position. The main rotation movement of spindle 2 of the said tap is limited by means of a pin 3 fixed to the said spindle and which moves in a slot 4 of bearing 5 integral with the tap.

In the inoperative position shown in FIG. 3, pin 3 engages in a recess 6 of slot 4 under the action of a not shown inner restoring spring which blocks any possible rotation movement of the tap spindle.

Figure 4:
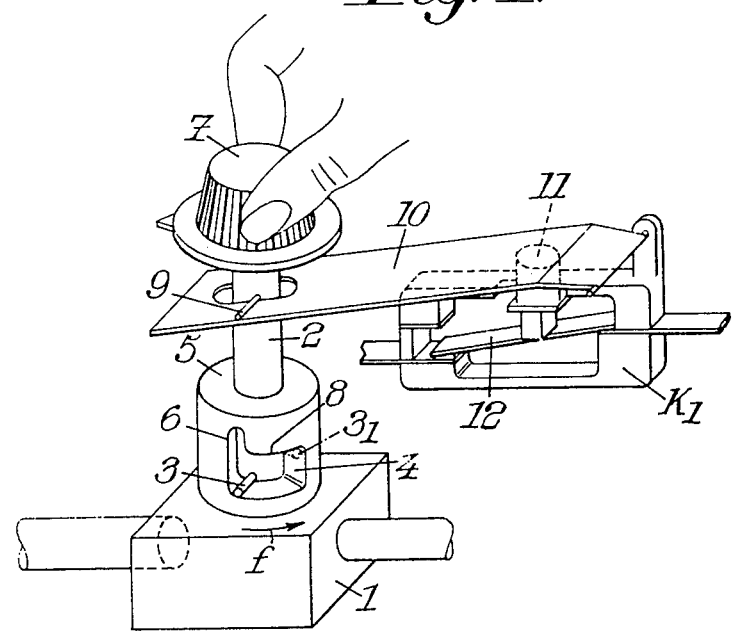

As known in such a tap the opening operation is performed, as shown in FIG. 4, by initially pressing on spindle 2 by means of control button 7 to bring about unlocking whereby pin 3 leaves its recess 6 and then actuates spindle 2 in the direction of arrow $f$. At the end of the opening movement, the operator releases the button in such a way that the assembly is returned by the restoring spring and the pin abuts against an edge 8 of notch 4, for example at $3_1$.

A to and fro movement is used for controlling switch $K_1$.

To this end, for example, another pin 9 carried by spindle 2 acts on a blade 10 which in turn acts at 11 on contact 12 of switch $K_1$.

It can be seen that in the closed position of the tap (FIG. 3), contact 12 is closed whereas on operating the tap in the opening direction thereof the said contact instantaneously closes, as shown in FIG. 4, and then opens again when the operator releases control button 7. At $3_1$, pin 3 abuts against edge 8 where blade 10 returns to its initial position. Thus, ignition is started by operating gas tap button 7.

It should be noted that the closing of the tap does not require any unlocking action because the return to the inoperative position is performed by simple reverse rotation without actuating switch $K_1$.

It is easily possible to conceive other arrangements giving the same effect, more particularly by means of a blade 10 of appropriate configuration operating the same switch $K_1$ from several taps.

Thus, no matter what embodiment is adopted, assemblies and particularly igniters are obtained whose fundamental operation has been adequately described hereinbefore without it being necessary to give further details and having numerous advantages relative to the hitherto known assemblies of this type. The particular advantages are that it is possible to operate the appliance by a single control pulse, the neon tube or the like is always ready to operate and the assembly system is extremely simple.

While there has been described and illustrated the preferred embodiments of the invention, it is to be understood that these are capable of variation and modification and it is therefore not desired to be limited to the precise details set forth but to include such modifications and alterations as fall within the scope of the appended claims.

I claim:

1. A system of the type comprising a thyristor having a threshold triggering level triggered from a relaxation oscillator, in particular an electrical igniter for gas burners, the improvement wherein said relaxation oscillator comprises a capacitor and a neon tube connected thereto, means for charging the capacitor to the ionization potential of the neon tube, whereby the neon tube conducts and forms a discharge current path for said capacitor, means for providing said discharge current to said thyristor as a triggering pulse, and electronic means for gradually decreasing the intensity of the triggering pulses supplied by the oscillator to an intensity below the threshold triggering level of the thyristor while maintaining the capacitor charging current, whereby triggering automatically stops after a predetermined time while the relaxation oscillator continues to oscillate.

2. A system according to claim 1 wherein said electronic means comprises a timing mechanism formed by a resistance placed in series in the capacitor discharge current path with a second capacitor and a diode connected in parallel with said resistance, the diode being oriented in such a way as to charge the second capacitor under the action of triggering pulses supplied by the oscillator.

3. A system according to claim 2 wherein in said timing mechanism is provided with a switch connected across said second capacitor, thereby permitting at any time the discharge of the second capacitor of this circuit and initiating a new cycle of triggering pulses.

4. A system according to claim 3 wherein the switch permitting the second capacitor discharge is responsive to at least one gas tap in such a way that the opening of this tap causes the instantaneous closing of the switch.

5. A system according to claim 3, with a tap of the type whose control spindle undergoes a to and fro movement under the action of a restoring spring for locking and unlocking purposes wherein this to and fro movement is used for controlling the switch.

6. A system according to claim 2 wherein the second capacitor of the timing mechanism has a value at least 10 times greater than that of the capacitor of the relaxation osciallator circuit.

7. A system according to claim 2, further comprising a resistor $R_3$ in series with the capacitor of the relaxation oscillator, wherein the value of resistance $R_6$ of the timing mechanism in parallel at the terminals of the capacitor of this circuit is much lower than the resistance $R_3$ of the integrating circuit of the relaxation oscillator.

8. A system according to claim 1 wherein in the relaxation oscillator circuit are provided means for modifying the amplitude of the relaxation oscillator oscillations so as to adjust the delay period.

9. A system according to claim 8 wherein the said means comprise a variable resistance $R_5$, connected between the two electrodes of the thyristor in the discharge path of the relaxation oscillator capacitor which therefore influences the amplitude of the oscillations and permits the adjustment of the delay.

\* \* \* \* \*